(12) United States Patent
Nakamura

(10) Patent No.: US 6,875,996 B2
(45) Date of Patent: Apr. 5, 2005

(54) FIELD-EFFECT ORGANIC TRANSISTOR

(75) Inventor: Shinichi Nakamura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/847,856

(22) Filed: May 19, 2004

(65) Prior Publication Data

US 2004/0232411 A1 Nov. 25, 2004

(30) Foreign Application Priority Data

May 20, 2003 (JP) ........................................ 2003-141924

(51) Int. Cl.[7] .......................... H01L 35/24; H01L 51/00
(52) U.S. Cl. ........................................................ 257/40
(58) Field of Search .......................................... 257/40

(56) References Cited

U.S. PATENT DOCUMENTS

| | | | |
|---|---|---|---|
| 6,107,117 A | 8/2000 | Bao et al. | 438/99 |
| 6,692,658 B2 | 2/2004 | Nakamura et al. | 252/299.65 |
| 2002/0047104 A1 | 4/2002 | Igawa et al. | 252/299.01 |

FOREIGN PATENT DOCUMENTS

JP 2001-94107 4/2001

OTHER PUBLICATIONS

J. R. Reimers, et al., "Molecular electronic properties of fused rigid porphyrin–oligomer molecular wires", *Nanotechnology*, vol. 7, 1996, pp. 424–429.

X. Linda Chen, et al., "Ion–modulated ambipolar electrical conduction in thin–film transistors based on amorphous conjugated polymers", *Applied Physics Letters*, vol. 78, No. 2, Jan. 8, 2001, pp. 228–230.

Akihiko Tsuda, et al., "Syntheses, Structural Characterizations, and Optical and Electrochemical Properties of Directly Fused Diporphyrins", *J. American Chemical Society*, vol. 123, No. 42, 2001, pp. 10304–10321.

Benedikt Schlicke, et al., "Extended π–systems: synthesis and characterization", *Synthetic Metals*, vol. 83, 1996, pp. 173–176.

*Primary Examiner*—Thien F Tran
(74) *Attorney, Agent, or Firm*—Fitzpatrick, Cella, Harper and Scinto

(57) ABSTRACT

It is an object of the present invention to solve the problems of the conventional organic transistors, such as a low mobility, a high threshold voltage and fluctuation of a threshold voltage in driving for a long period. The field-effect organic transistor of the present invention comprises 3 electrodes being source, drain and gate electrodes, a gate insulating layer and an organic semiconductor layer, wherein the organic semiconductor layer contains an organic semiconductor having 2 or more repeating units, each of the repeating units having a condensed aromatic ring compound having 10 or more conjugate double bonds and 3 two-fold axes.

12 Claims, 2 Drawing Sheets

FIELD-EFFECT ORGANIC TRANSISTOR

BACKGROUND OF THE INVENTION

1. Field of the Invention

The present invention relates to a field-effect organic transistor, more specifically a field-effect organic transistor useful for the electronic devices, e.g., displays, information tags and ICs.

2. Related Background Art

An organic transistor which utilizes an organic semiconductor can be formed on a plastic substrate and into a large picture plane, while a silicon transistor has difficulty in this regard, and has been increasingly expected to apply to new devices, e.g., flexible electronic paper and information tags.

An organic semiconductor produced by a vacuum evaporation process is disclosed by Japanese Patent Application Laid-Open No. 2001-094107, and an organic semiconductor produced by a liquid-phase process is disclosed by U.S. Pat. No. 6,107,117.

However, the organic semiconductors proposed so far have a disadvantage of a low mobility, limited to the order of $10^{-1}$ cm$^2$/Vs for production by vacuum evaporation process, and $10^{-2}$ cm$^2$/Vs for production by a liquid-phase process. Other problems involved in organic transistors are a high threshold voltage and fluctuation of a threshold voltage in driving for a long period. Few organic transistors have been commercialized because of these problems.

The present invention has been accomplished to solve these problems in the conventional techniques. It is an object of the present invention to provide a new field-effect organic transistor having an organic semiconductor layer for solving the problems of the prior art.

SUMMARY OF THE INVENTION

The present invention provides a field-effect organic transistor with a high mobility, a low threshold voltage and improved fluctuation of a threshold voltage, comprising an organic semiconductor layer containing an organic semiconductor having 2 or more repeating units, each of the repeating units having a condensed aromatic ring compound having 10 or more conjugate double bonds and 3 two-fold axes.

The field-effect organic transistor of the present invention comprises: 3 electrodes being source, drain and gate electrodes; a gate insulating layer; and an organic semiconductor layer, wherein the organic semiconductor layer contains an organic semiconductor having 2 or more repeating units, each of the repeating units having a condensed aromatic ring compound having 10 or more conjugate double bonds and 3 two-fold axes. The number of the repeating units of the condensed aromatic ring compound is preferably 2 or more but 1000 or less, more preferably 2 or more but 200 or less. The number of the conjugate double bonds of each repeating unit of the condensed aromatic ring compound is preferably 10 or more but 20 or less. The energy band gap of the condensed aromatic ring compound is preferably 1 eV or less. The condensed aromatic ring compound is preferably produced by a liquid-phase process. The condensed aromatic ring compound is preferably oriented. Further, the major axis direction of the condensed aromatic ring compound is preferably oriented in parallel to the direction of charges flowing between the source and drain electrodes. The gate insulating layer is preferably made of an organic compound.

The present invention can provide a field-effect organic transistor having a high mobility and a low threshold voltage and small fluctuate of a threshold voltage, and useful for electronic devices, e.g., displays, information tags and ICs.

DESCRIPTION OF THE PREFERRED EMBODIMENTS

Figure 1:
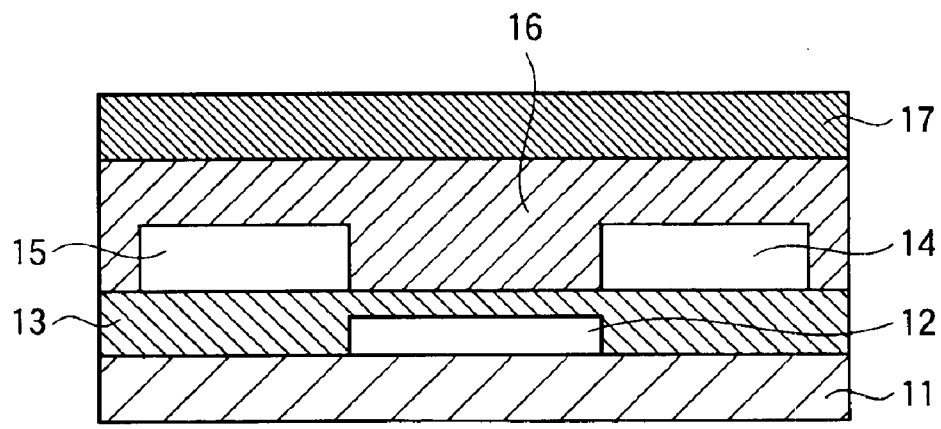
FIG. 1 is a cross-sectional view schematically showing one example of the field-effect organic transistor of the present invention.

The field-effect organic transistor of the present invention is described with respect to a planar type as an example by referring to FIG. 1, although it is structurally useful for any of planar, staggered, reverse staggered and SIT. On a insulating substrate 11, a gate electrode 12, a gate insulating layer 13, a source electrode 14 and a drain electrode 15, and an organic semiconductor layer 16 are arranged in mentioned order, and a protective layer 17 is arranged thereon as the uppermost layer.

Figure 4:
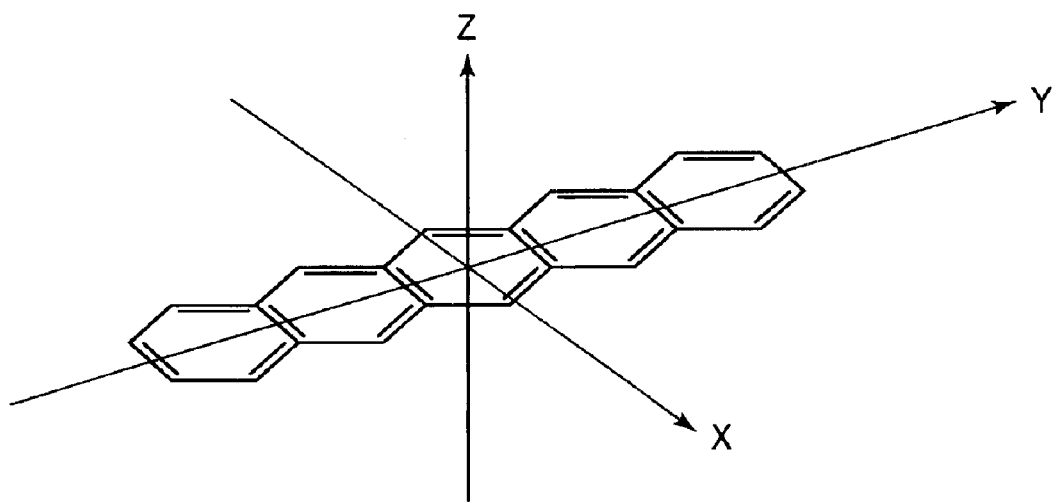
FIG. 4 is an illustration of a two-fold axis of pentecene.

The field-effect organic transistor of the present invention includes an organic semiconductor layer containing an organic semiconductor having 2 or more repeating units, each of the repeating units having a condensed aromatic ring compound having 10 or more conjugate double bonds and 3 two-fold axes. The organic semiconductor layer of the present invention having the above features is found to be particularly effective for realizing (1) a high mobility, (2) a low threshold voltage, and (3) small fluctuation of a threshold voltage. A compound having a two-fold axis means that it takes exactly the same structure twice, at 180 and 360°, when it goes into a 360-degree roll around an axis of rotation. Pentacene, which is a compound widely used for organic semiconductor layers, has 3 two-fold axes in the X, Y and Z directions as shown in FIG. 4. However, it has only 3 conjugate double bonds in its repeating unit. Poly (benzimidazolebenzophenanthroline), described in APPLIED PHYSICS LETTERS, Vol. 78, 2, 228, 2001, is a condensed aromatic ring compound which has 10 or more conjugate double bonds but only one two-fold axis. The inventor of the present invention has concluded, after having extensively studied to search for what practical, high-performance organic semiconductor layers are, that use of a condensed aromatic ring compound satisfying the above-described conditions is effective. More specifically, 10 or more conjugate double bonds in a repeating unit promotes delocalization of charges, and 3 two-fold axes improves symmetry to obtain high structural regularity. The synergistic effect by these conditions realizes a high mobility, a low threshold voltage and small fluctuation of a threshold voltage, which has not been achieved so far by the conventional technologies.

The number of the repeating units of a condensed aromatic ring compound is preferably 2 or more but 1000 or less for easiness of synthesis and solubility in a solvent, and the like, more preferably 2 or more but 200 or less. The number of conjugate double bonds in each repeating unit is preferably 10 or more but 20 or less for easiness of synthesis and solubility in a solvent, and the like. Moreover, the energy band gap of the condensed aromatic ring compound is 1 eV or less, in order to remarkably exhibit the effect of the present invention.

The structures of the condensed aromatic ring compounds for the organic semiconductor layer in the present invention include those specifically described by the general formulae (I) to (IV), although not limited thereto.

Tb, Dy, Ho, Er, Tm, Yb, Lu, Ti, Zr, Hf, V, Nb, Ta, Th, U, Cr, Mo, Mn, Tc, Re, Fe, Ru, Os, Co, Rh, Ir, Ni, Pd, Pt, Cu, Ag, Au, Cd, Hg, Al, Ga, In, Tl, Si, Ge, Sn, Pb, As, Sb or Bi; and "n" is an integer of 2 to 1000, inclusive.

These compounds can be produced by the procedures described in NANOTECHNOLOGY, Vol. 7, p.424, (1996), SYNTH. MET., Vol. 83, p.173, (1996), or J. AM. CHEM. SOC., Vol. 123, No. 42, p.10304, (2001).

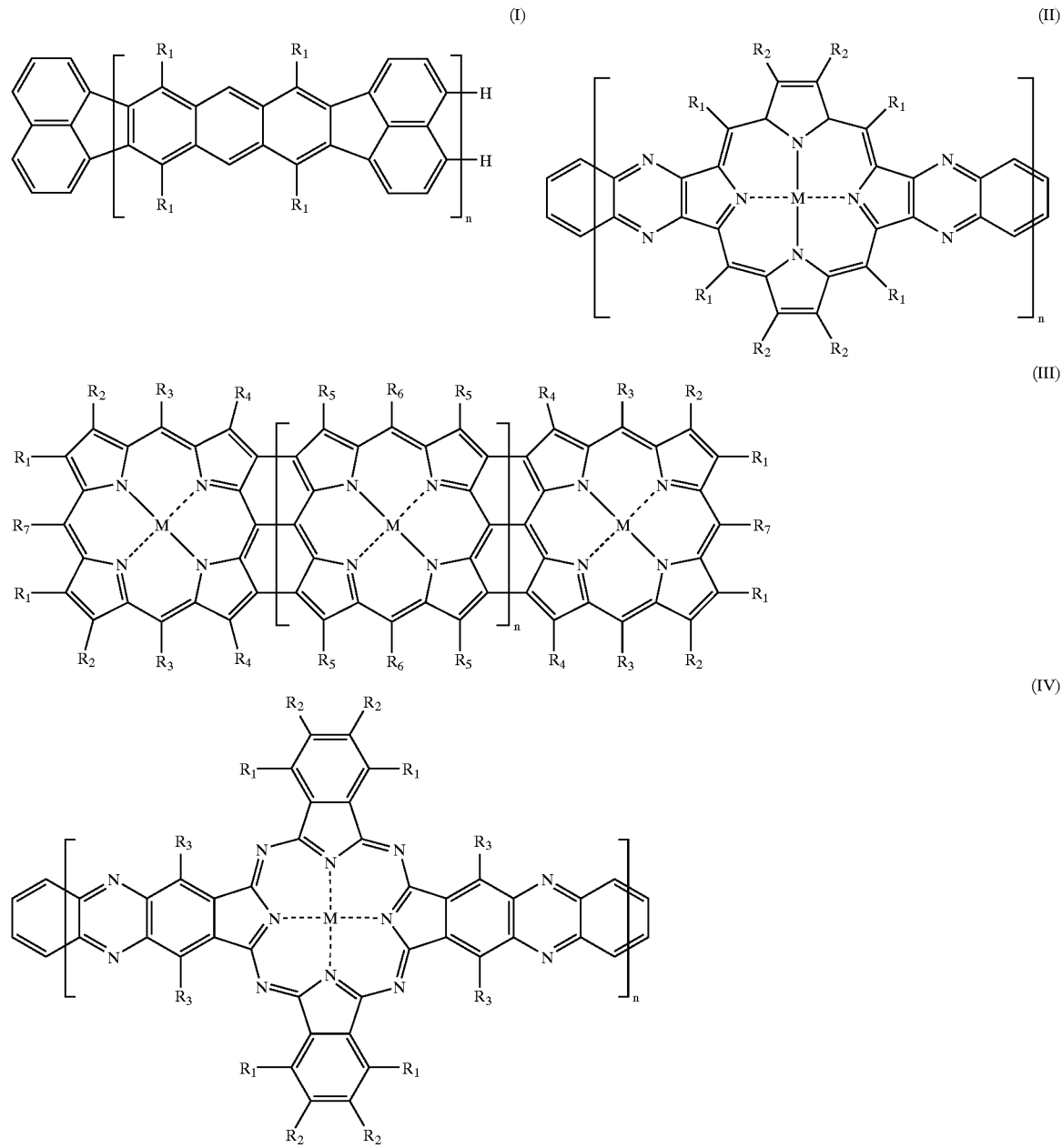

In the formulae (I) to (IV), $R_1$ to $R_7$ are hydrogen, a halogen, OH, $NO_2$, $NH_3$, COOH, CN, $SO_3H$, SH, or alkyl or perfluoroalkyl group of 1 to 50 carbon atoms, which may have a substituent. One or more methylenes in the alkyl group may be replaced by an aromatic ring (benzene, pyridine, pyrimidine, pyrrol, furan and thiophene which may have a substituent), or by O, CO, S or NH. M is metal-free, or Zn, Mg, Ca, Sr, Ba, Sc, Y, La, Ce, Pr, Nd, Sm, Eu, Gd, The organic semiconductor layer for the present invention may be incorporated with an adequate dopant to control its electroconductivity. The dopants useful for the present invention include acceptors, e.g., $I_2$, $Br_2$, $Cl_2$, $BF_3$, $PF_5$, $H_2SO_4$, $FeCl_3$ and TCNQ (tetracyanoquinodimethane); donors, e.g., Li, K, Na and Eu; and surfactants, e.g., an alkyl sulfonate and alkyl benzene sulfonate. The organic semiconductor layer for the present invention is preferably produced by a liquid-phase process, viewed from production of a large area at a low cost. The procedure for forming the organic semiconductor layer is not limited, and it may be formed by electrolytic polymerization, casting, spin coating, dip coating, screen printing, micromolding, microcontacting, roll coating, ink jetting, LB method or the like.

The condensed aromatic ring compound is preferably oriented to allow the present invention to exhibit its effects more notably. Moreover, the major axis of the condensed aromatic ring compound is preferably oriented in parallel to the direction of charges flowing between the source and drain electrodes. The orientation procedure is not limited. The effective procedures include rubbing, stretching, friction transfer and orientation in a magnetic field.

The gate insulating layer for the present invention is not limited. The materials useful for the layer include inorganic materials, e.g., $SiO_2$, SiNx, $Al_2O_3$ and $Ta_2O_5$; organic materials, e.g., polyimide, polyacrylonitrile, polytetrafluoroethylene, polyvinyl alcohol, polyvinyl phenol, polyethylene terephthalate and polyvinylidene fluoride; and organic/inorganic hybrids. An organic material is more preferable, because it can be formed by a liquid-phase process, which can realize low-cost production.

The insulating substrate is not limited. The materials useful for the insulating substrate include inorganic materials, e.g., glass and quartz; photosensitive polymer compounds, e.g., acryl-, vinyl-, ester-, imido-, urethane-, diazo- and cinnamoyl-based compounds; organic materials, e.g., polyvinylidene fluoride, polyethylene terephthalate and polyethylene; and organic/inorganic hybrids. 2 or more layers composed of these materials may be stacked, which is effective for enhancing a breakdown voltage.

The gate, source, and drain electrodes for the present invention are not limited, so long as they are electroconductive. Metals, e.g., Al, Cu, Ti, Au, Pt, Ag and Cr, and inorganic materials, e.g., polysilicon, silicide, ITO (Indium Tin Oxide) and $SnO_2$ are suitable. The other useful materials include electroconductive polymer compounds represented by polypyridine, polyacetylene, polyaniline, polypyrrole and polythiophene incorporated with a dopant at a high concentration, and electroconductive ink dispersed with carbon particles, silver particles or the like. When the present invention is applied to a flexible electronic paper, in particular, each electrode is preferably made of an electroconductive polymer compound, electroconductive ink dispersed with carbon particles, silver particles or the like in consideration of matching with the substrate in thermal expansion coefficient.

The method for forming each of the electrodes and the gate insulating layer is not limited. When an organic material is used, each may be formed by electrolytic polymerization, casting, spin coating, dip coating, screen printing, micromolding, microcontacting, roll coating, ink jetting, LB method or the like. The other effective methods include vacuum evaporation, CVD, electron beam evaporation, resistance-heated evaporation and sputtering, depending on the material used. They may be patterned to have a desired shape by photolithography or etching. The other effective patterning methods include soft lithography and ink jetting. A leading electrode from each electrode, a protective layer for each electrode or the like may be formed, as required.

The present invention is described in more detail referring to the following Examples, which by no means limit the present invention.

EXAMPLE 1

Figure 2:
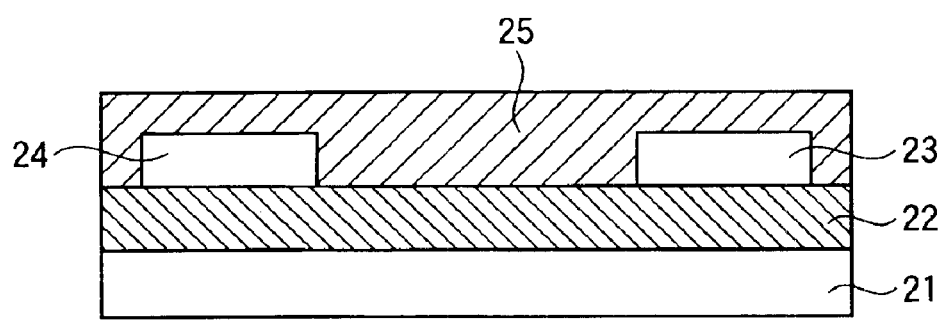
FIG. 2 is a cross-sectional view schematically showing a field-effect organic transistor prepared in Example.

FIG. 2 shows a structure of the field-effect organic transistor prepared in Example 1.

As the gate electrode 21, an n-type, highly-doped silicon substrate was used; as the gate insulating layer 22, $SiO_2$ was used; as the source electrode 23 and the drain electrode 24, a chromium/gold stack was used; and as the organic semiconductor layer 25, the condensed aromatic ring compound A represented by the following chemical formula.

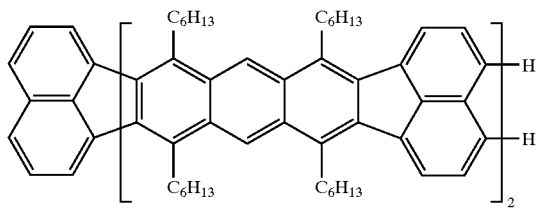

The procedure for forming the field-effect organic transistor is described below.

On the silicon substrate, a 300 nm thick, thermally oxidized film $SiO_2$ was formed. The source and drain electrodes of chromium (thickness: 5 nm)/gold (thickness: 100 nm) having a channel length of 50 $\mu$m and a channel width of 50 mm were formed thereon by the lift-off method. The organic semiconductor layer 25 was formed by sublimating the condensed aromatic ring compound A in a metal sublimating boat being 10 cm apart from the substrate, at $5\times10^{-6}$ torr at an average sublimation rate of 0.1 nm/second and by depositing the compound A on the substrate kept at 25° C. by a thickness of 100 nm. The field-effect organic transistor was completed by connecting the gate, drain and source electrodes by a 0.1 mm-diameter gold wire, which were attached by a silver paste.

Next, the drain current of the field-effect organic transistor was measured in a range of a gate voltage of 0 to –50 V and in a range of a voltage of 0 to –50 V between the source and drain electrodes. Threshold voltage Vth was determined by extrapolating the relationship between the square root of drain current and the gate voltage to the drain voltage Id=0. Mobility $\mu$ was calculated by the formula (I).

$$\mu = Id/\{W/2L\}Ci(Vg-Vth)^2\} \quad (I)$$

In the formula (I), $\mu$ is a mobility, Id is a drain current, W is a channel width, L is a channel length, Ci is a capacity of the gate insulating layer per unit area, Vg is a gate voltage and Vth is a threshold voltage.

Next, fluctuation of threshold voltage was determined by subtracting the first measured value by the 100th measured value. The results are given below.

Threshold voltage: –2.3 V
$\mu$: 1.5 $cm^2$/Vs
Fluctuation of threshold voltage: 0.2 V Comparative Example 1

The field-effect organic transistor was produced in the same manner as in Example 1, except that the pentacene represented by the following chemical formula was used for the organic semiconductor layer 25.

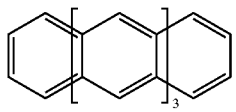

Next, the field-effect organic transistor was evaluated in the same manner as in Example 1 for the threshold voltage, the fluctuation and the mobility. The results are given below.
Threshold voltage: −10.7 V
$\mu$: $3.2 \times 10^{-2}$ cm$^2$/Vs
Fluctuation of threshold voltage: 2.5 V

Comparative Example 2

The field-effect organic transistor was produced in the same manner as in Example 1, except that the perylene derivative represented by the following chemical formula 7 was used for the organic semiconductor layer 25.

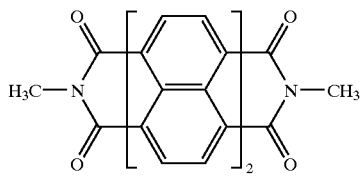

Next, the field-effect organic transistor was evaluated in the same manner as in Example 1 for the threshold voltage, the fluctuation and the mobility, except that drain current was measured in a range of a gate voltage of 0 to 50 V and in a range of a voltage of 0 to 50 V between the source and drain electrodes. The results are given below.
Threshold voltage: 12.4 V
$\mu$: $4.2 \times 10^{-3}$ cm$^2$/Vs
Fluctuation of threshold voltage: 3.1 V

Comparative Example 3

The field-effect organic transistor was produced in the same manner as in Example 1, except that the condensed aromatic ring compound B represented by the chemical formula was used for the organic semiconductor layer 25.

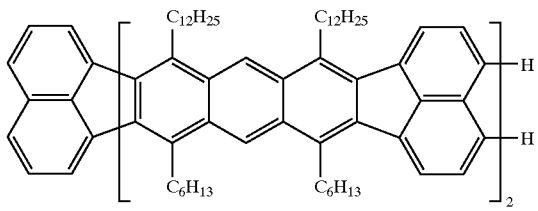

Next, the field-effect organic transistor was evaluated in the same manner as in Example 1 for the threshold voltage, the fluctuation and the mobility. The results are given below.
Threshold voltage: −3.8 V
$\mu$: $6.3 \times 10^{-2}$ cm$^2$/Vs
Fluctuation of threshold voltage: 1.4 V As described above, the field-effect organic transistor prepared in each of Comparative Examples 1 to 3 had a lower mobility, a higher threshold voltage and larger fluctuation of the threshold voltage than the field-effect organic transistor prepared in Example 1.

EXAMPLE 2

The field-effect organic transistor having the same structure as the one prepared in Example 1 as shown in FIG. 2 was prepared using an n-type, highly-doped silicon substrate as the gate electrode 21, SiO$_2$ as the gate insulating layer 22, the chromium/gold stack as the source electrode 23 and the drain electrode 24, and the condensed aromatic ring compound C represented by the following chemical formula as the organic semiconductor layer 25.

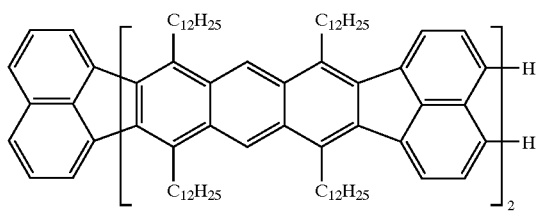

The procedure for forming the field-effect organic transistor is described below.

On the silicon substrate 21, a 300 nm thick, thermally oxidized film SiO$_2$ was formed. The source and drain electrodes of chromium (thickness: 5 nm)/gold (thickness: 100 nm) having a channel length of 50 $\mu$m and a channel width of 50 mm were formed thereon by the lift-off method. The organic semiconductor layer 25 was formed thereon by applying a 0.01 g/mL chloroform solution of the condensed aromatic ring compound C by spin coating, and drying at 150° C. for 12 hours. The field-effect organic transistor was completed by connecting the gate, drain and source electrodes by a 0.1 mm-diameter gold wire, which were attached by a silver paste.

Next, the field-effect organic transistor was evaluated in the same manner as in Example 1 for the threshold voltage, the fluctuation and the mobility. The results are given below.

Threshold voltage: −2.9 V
$\mu$: $4.1 \times 10^{-1}$ cm$^2$/Vs
Fluctuation of threshold voltage: 0.1 V

EXAMPLE 3

The field-effect organic transistor having the same structure as prepared in Example 2, as shown in FIG. 2 was prepared using an n-type, highly-doped silicon substrate as the gate electrode 21, polyvinyl phenol as the gate-insulating layer 22, gold as the source electrode 23 and the drain electrode 24, and the condensed aromatic ring compound C as the organic semiconductor layer 25.

The procedure for forming the field-effect organic transistor is described below.

2-propanol solution of polyvinyl phenol (0.1 g/mL) was applied by spin coating on the silicon substrate and dried at 150° C. for 6 hours to form a gate insulating layer. Thereon, gold (50 nm) was deposited by vacuum evaporation to produce source and drain electrodes with a channel length of 50 $\mu$m and a channel width of 10 mm. Thereon, chloroform solution of the condensed aromatic ring compound C (0.01 g/ml) was applied by spin coating and dried at 150° C. for 12 hours to form an organic semiconductor layer 25. The gate electrode, the drain electrode and the source electrode were connected with 0.1 mm-diameter gold wires which were attached with a silver paste, thereby producing an field-effect organic transistor.

Next, the field-effect organic transistor was evaluated in the same manner as in Example 1 for the threshold voltage, the fluctuation and the mobility. The results are given below.
Threshold voltage: −3.2 V

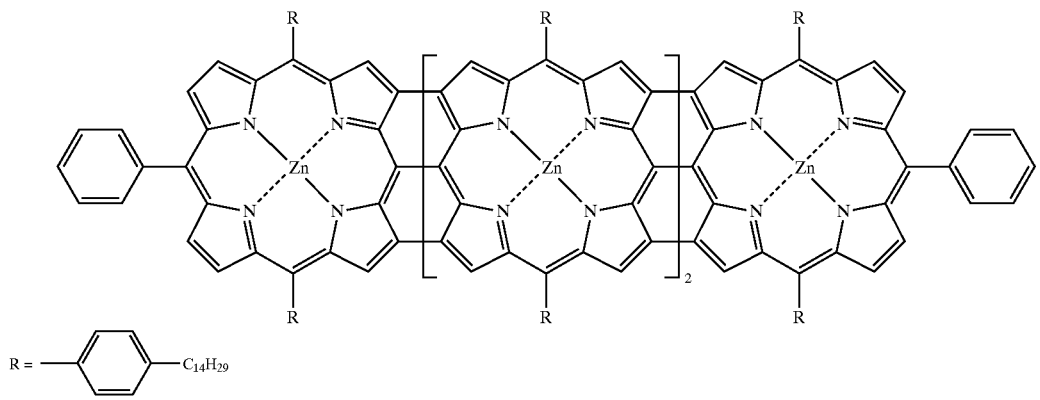

$\mu$: 1.3×10$^{-1}$ cm$^2$/Vs
Fluctuation of threshold voltage: 0.1 V

EXAMPLE 4

Figure 3:
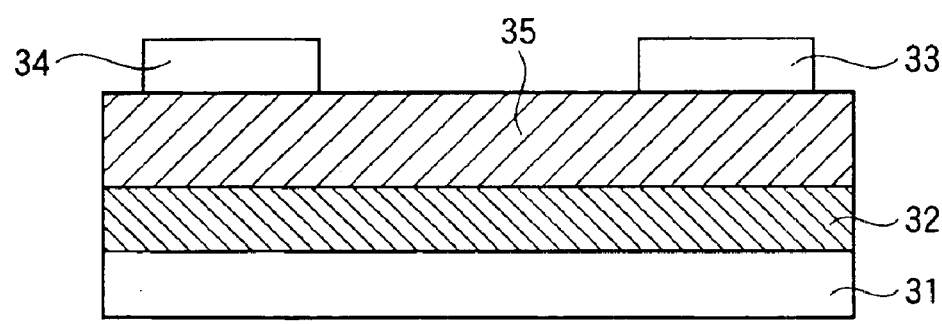
FIG. 3 is a cross-sectional view schematically showing another field-effect organic transistor prepared in Example.

FIG. 3 shows the structure of another field-effect organic transistor of the present invention.

The field-effect organic transistor was prepared using an n-type, highly-doped silicon substrate as the gate electrode 31, polyvinyl phenol as the gate-insulating layer 32, gold as the source electrode 33 and the drain electrode 34, and the condensed aromatic compound C as the organic semiconductor layer 35.

The procedure for forming the field-effect organic transistor is described below.

2-propanol solution of polyvinyl phenol (0.1 g/ml) was applied thereon by spin coating and dried at 150° C. for 6 hours to form a gate insulating layer. Then, chloroform solution of the condensed aromatic ring compound C (0.01 g/ml) was applied by spin coating on the substrate and dried at 150° C. for 12 hours to form an organic semiconductor layer 35. Then, gold (50 nm) was deposited by vacuum evaporation thereon to produce source and drain electrodes with a channel length of 50 μm and a channel width of 10 mm. The gate electrode, the drain electrode and the source electrode were connected with 0.1 mm-diameter gold wires which were attached with a silver paste, thereby producing an field-effect organic transistor.

Next, the field-effect organic transistor was evaluated in the same manner as in Example 1 for the threshold voltage, the fluctuation and the mobility. The results are given below.
Threshold voltage: −3.1 V
$\mu$: 5.2×10$^{-1}$ cm$^2$/Vs
Fluctuation of threshold voltage: 0.2 V

EXAMPLE 5

The field-effect organic transistor having the same structure as prepared in Example 4, as shown in FIG. 3 was prepared using an n-type, highly-doped silicon substrate as the gate electrode 31, polyimide as the gate insulating layer 32, gold as the source electrode 33 and the drain electrode 34, and the condensed aromatic ring compound D represented by the following chemical formula as the organic semiconductor layer 35.

This compound D has an absorption edge of 1500 nm and a calculated energy band gap of 0.8 eV.

The procedure for forming the field-effect organic transistor is described below γ-butyrolactone solution of polyimide (0.1 g/ml) was applied by spin coating on the silicon substrate and dried at 150° C. for 6 hours to form a gate insulating layer, which was then surface-treated by rubbing. Then, chloroform solution of the condensed aromatic ring compound D (0.01 g/ml) was applied by spin coating thereon and dried at 150° C. for 12 hours to form an organic semiconductor layer 35. Then, gold (50 nm) was deposited by vacuum evaporation thereon to produce source and drain electrodes with a channel length of 50 μm and a channel width of 10 mm. The electrodes were arranged so that the rubbing direction is in parallel with the direction of the charge flowing between the source and drain electrodes. The gate electrode, the drain electrode and the source electrode were connected with 0.1 mm-diameter gold wires which were attached with a silver paste, thereby producing an field-effect organic transistor.

Next, the field-effect organic transistor was evaluated in the same manner as in Example 1 for the threshold voltage, the fluctuation and the mobility. The results are given below.

Threshold voltage: −1.8 V
$\mu$: 1.2×10$^{-1}$ cm$^2$/Vs
Fluctuation of threshold voltage: 0.1 V

Comparative Example 4

The field-effect organic transistor was produced in the same manner as in Example 5, except that the condensed aromatic ring compound E represented by the following chemical formula was used for the organic semiconductor layer 35.

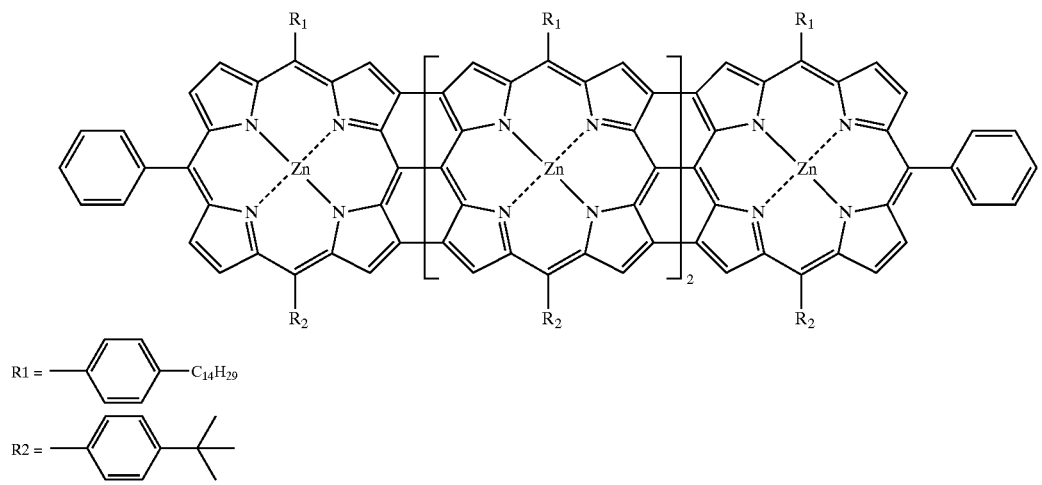

Next, the field-effect organic transistor was evaluated in the same manner as in Example 1 for the threshold voltage, the fluctuation and the mobility. The results are given below.
Threshold voltage: −3.1 V
$\mu$: $8.7\times10^{-2}$ cm$^2$/Vs
Fluctuation of threshold voltage: 0.6 V As described above, the field-effect organic transistor prepared in Comparative Example 4 had a lower mobility, a higher threshold voltage and larger fluctuation of threshold voltage than the field-effect organic transistor prepared in Example 5.

It is apparent, from the comparison between Example 1 and Comparative Examples 1, 2 and 3, and between Example 5 and Comparative Example 4, use of the condensed aromatic ring compound which satisfies the conditions of the present invention is found to be effective for improving characteristics of the field-effect organic transistor.

What is claimed is:

1. A field-effect organic transistor comprising: 3 electrodes being source, drain and gate electrodes; a gate insulating layer; and an organic semiconductor layer, wherein the organic semiconductor layer contains an organic semiconductor having 2 or more repeating units, each of the repeating units having a condensed aromatic ring compound having 10 or more conjugate double bonds and 3 two-fold axes.

2. The field-effect organic transistor according to claim 1, wherein a number of the repeating units is 2 or more but 1000 or less.

3. The field-effect organic transistor according to claim 1, wherein a number of the repeating units is 2 or more but 200 or less.

4. The field-effect organic transistor according to claim 1, wherein a number of the conjugate double bonds of the condensed aromatic ring compound in each of the repeating units is 10 or more but 20 or less.

5. The field-effect organic transistor according to claim 1, wherein an energy band gap of the organic semiconductor is 1 eV or less.

6. The field-effect organic transistor according to claim 1, wherein the organic semiconductor layer is formed from the condensed aromatic ring compound by a liquid-phase process.

7. The field-effect organic transistor according to claim 1, wherein the condensed aromatic ring compound is oriented.

8. The field-effect organic transistor according to claim 1, wherein a major axis direction of the condensed aromatic ring compound is oriented in parallel to a direction of charges flowing between the source and drain electrodes.

9. The field-effect organic transistor according to claim 1, wherein the gate insulating layer is made of an organic compound.

10. The field-effect organic transistor according to claim 1, wherein the organic semiconductor contains as a dopant at least one selected from the group consisting of $I_2$, $Br_2$, $Cl_2$, $BF_3$, $PF_5$, $H_2SO_4$, $FeCl_3$ and tetracyanoquinodimethane.

11. The field-effect organic transistor according to claim 1, wherein the organic semiconductor contains as a dopant at least one selected from the group consisting of Li, K, Na and Eu.

12. A device comprising a field-effect organic transistor and a display device, wherein the field-effect organic transistor comprises 3 electrodes being source, drain and gate electrodes, a gate insulating layer, and an organic semiconductor layer containing an organic semiconductor having 2 or more repeating units, each of the repeating units having a condensed aromatic ring compound having 10 or more conjugate double bonds and 3 two-fold axes.

* * * * *